United States Patent [19]

Teng et al.

[11] Patent Number: 4,511,597

[45] Date of Patent: Apr. 16, 1985

[54] METHOD FOR DEPOSITING A METAL ON A SURFACE

[75] Inventors: Yu-Ling Teng, Douglaston; Richard Mayernik, North Merrick, both of N.Y.

[73] Assignee: Kollmorgen Technologies Corporation, Dallas, Tex.

[21] Appl. No.: 541,048

[22] Filed: Oct. 12, 1983

[51] Int. Cl.$^3$ ............................................. B05D 3/06
[52] U.S. Cl. ................................... 427/53.1; 427/98; 430/417
[58] Field of Search ....................... 427/53.1, 54.1, 98, 427/443.1; 430/417

[56] References Cited

U.S. PATENT DOCUMENTS 4,268,536  5/1981  Beckenbaugh et al. .......... 427/443.1
4,304,849 12/1981  Beckenbaugh et al. ............ 430/417

OTHER PUBLICATIONS

Article entitled "A New Process For Patterning Printed Wiring Boards", from Electronic Packaging and Production, Dec. 1981.

Primary Examiner—John H. Newsome
Attorney, Agent, or Firm—Morgan, Finnegan, Pine, Foley & Lee

[57] ABSTRACT

An improved method for making conductive metal patterns involving the steps of treating a substrate with a solution comprising a reducible salt of a non-noble metal and a light radiation sensitive reducing compound, exposing said substrate to light radiant energy, fixing with a solution comprised of a complexing agent followed by electroless deposition, the improvement comprising extending the bath life of said fixing solution by maintaining the concentration of the light sensitive reducing compound on the fixing solution so that it does not exceed 0.4 m moles/liter.

19 Claims, No Drawings

METHOD FOR DEPOSITING A METAL ON A SURFACE

BACKGROUND OF THE INVENTION

This invention relates to a method of depositing metal on a surface and more particularly, to an improved method for the production of quality circuit boards with good line definition and clean non-conductor area as well as for extending the bath life of fixing solutions employed in the manufacture of printed circuit boards involving a photo-sensitive electroless deposition process.

The photosensitive process as originally developed by Polichette in U.S. Pat. Nos. 3,772,056, 3,722,078, 3,907,621, 3,930,963, 3,925,578, 3,959,547, 3,993,802 and 3,994,727, used water as the image developing media. The image was formed by a light sensitive mixture of a copper salt, anthraquinone disulfonic acid and a polyhydroxyl alcohol, such as glycerine, pentaerythritol or sorbitol. The mixture was applied from aqueous solution to a hydrophilic surface and subsequently dried under controlled conditions before light exposure. In the water development following light exposure the unexposed copper salts and anthraquinone disulfonic acid were rinsed away. The next step was reinforcement of the image formed by electroless plating to produce a copper conductor pattern.

In production, the process was plagued by copper deposits outside the conductor pattern. Increasing the water rinse or development either with longer time or more vigorous agitation resulted in a weakening of the image, characterized by breaks and voids in the conductor pattern. As an alternative to excessive rinsing or development, a number of intermediate process steps have been proposed for insertion between the water rinse or development and the electroless plating. The purpose of these steps is to fix the image before it is electrolessly plated.

Ehrich et al, U.S. Pat. No. 4,262,085, have proposed that the light image be intensified by immersion in a palladium sulfate solution followed by a nickel flash plating. Ehrich alleged that the undesired copper on the background from incomplete development would be removed and would not be a catalyst for electroless nickel. The nickel conductor can then be electroless copper plated to the required thickness without extraneous deposits.

Dafter, U.S. Pat. No. 4,084,023, has proposed a fixing solution consisting of an alkaline EDTA copper complexing solution and formaldehyde, a reducing agent for copper. The purpose of this solution was to dissolve away any incompletely developed copper from the background of the panel and at the same time prevent destruction of copper sites formed on the light image. This fixer solution was not completely successful.

Beckenbaugh, U.S. Pat. No. 4,181,750, proposed acid stripping solutions consisting of dilute citric or acetic acid solutions.

Madsen, U.S. Pat. No. 4,133,908, reported that the stripping and/or fixing solutions of Beckenbaugh, et al and Dafter were not effective. Madsen proposed an image stabilizer-potassium ferrocyanide addition to the Dafter fixing solution.

Beckenbaugh et al, U.S. Pat. No. 4,167,601 described the process of first fixing in Madsen's stabilizer solution followed by stripping in Beckenbaugh stripping solution.

Dafter, Beckenbaugh, Madsen and Beckenbaugh et al were all assigned to a common assignee.

Until now, the life span of fixing solutions employed in the above-described methods has been relatively short. Moreover, they were uncontrollable with respect to activity and adversely became colored after short periods of loading. As a result, workers in the field had to constantly replenish the fixing solutions, a measure which is time-consuming and costly.

It was believed that the aforedescribed shortcoming of fixing solutions was attributable to the build-up of certain contaminants after a short period of use. Simply replenishing the solutions by the addition of components did not solve the problem.

It is the objective of this invention to improve methods for making printed circuit boards involving fixing and electroless deposition steps by extending the bath life of the fixing solution employed. With the process improvement disclosed and claimed herein, the fixing solution is operable for extended periods of use and impurities which contaminate such solutions are effectively removed. The level of effectiveness of the so-treated solution is monitored spectrophotometrically, thus allowing for recycling of treated fixing solutions.

SUMMARY OF THE INVENTION

In accordance with this invention, there is disclosed the improvement in a method for making printed circuit boards by treating a substrate with a solution comprising a reducible salt of a non-noble metal and a light radiation sensitive reducing compound selected from quinones, benzoquinones, anthraquinones and derivatives thereof, and anthraquinone disulfonic acids and salts thereof; exposing the treated substrate to light radiant energy to reduce the metal salt to form a real image; and immersing the substrate in an electroless metal deposition bath to deposit a conductive metal pattern on the real image; the improvement comprising treating the exposed substrate prior to electrolessly depositing metal with a fixing solution comprising a complexing agent for the non-noble metal; said fixing solution being maintained so that the concentration of the light sensitive reducing compound in the fixing solution does not exceed 0.4 m moles/liter, and preferably does not exceed 0.15 m moles/liter.

In a more preferred embodiment, the concentration of light sensitive reducing compound is maintained by carbon treatment of the fixing solution when the concentration is 0.05 m moles/liter, spectrophotometrically determined.

In another embodiment, the reducible salt of non-noble metal is selected from the group consisting of reducible salts of copper, iron, nickel and cobalt.

In yet another embodiment, the light radiation sensitive reducing compound is an anthraquinone disulfonic acid salt, preferably, anthraquinone-2,6-disulfonic acid disodium salt or anthraquinone-2,7-disulfonic acid disodium salt.

In another embodiment, the complexing agent is selected from ethylenediaminetetraacetic acid (EDTA), triethanolamine, ethylenedinitrilotetra-2-propanol, (EDTP), malic acid, maleic acid, citric acid and tartaric acid.

In a further embodiment, the carbon treatment is effected in a continuous manner wherein the treated fixing solution is recycled during processing.

In another embodiment, the carbon employed is regenerated by treatment with sulfuric acid or sodium persulfate.

In a further embodiment, a fixing solution is employed comprised of a complexing agent for the non-noble metal and a reducing agent, the latter selected from formaldehyde or ascorbic acid.

DETAILED DESCRIPTION OF THE INVENTION

The process improvement disclosed herein pertains to the extension in bath life of fixing solutions. The improvement allows for the effective removal of impurities and contaminants thereby controlling the efficiency of the bath. The level of activity of the bath is uniquely monitored spectrophotometrically.

The method improved herein relates to the manufacture of printed circuit boards involving, inter alia, an electroless deposition step.

In the first step of the method improved herein, a substrate is treated with a solution comprising a reducible salt of a non-noble metal and a light radiation-sensitive reducing compound.

For printed circuits, among the materials which may be used as substrates are metal-clad or unclad insulating thermosetting resins, thermoplastic resins, ceramics, and mixtures of the foregoing, including fiber, e.g. fiberglass impregnated embodiments of the foregoing.

In producing the real image, the metal species nuclei are reduced from their salt or a composition of the salt in situ in selected areas on the surface of the substrate by application of light radiant energy, such as ultraviolet light and visible light, X-rays, electron beams, and the like.

The reducible metal salt can comprise, in general, a cation selected from the metals of Group VIII and IB of the Periodic Table of the Elements. The anion associated in such metal salts can vary widely and can comprise organic and inorganic anions such as halides, sulfates, nitrates, formates, gluconates, acetates and the like. Some typical salts include cupric formate, cupric gluconate, cupric acetate, cupric chloride, cupric nitrate, nickel chloride, ferrous sulfate and cobalt chloride.

The radiant energy sensitive compound used in association with the reducible metal has the property of absorbing radiant energy and transferring it, thus exercising a reducing action on the exposed metal salt. Such radiant energy-sensitive compounds form a family of scope well known to those skilled in the art. Because visible and ultraviolet light are the most convenient sources of radiant energy, the solutions used in this invention preferably contain such compounds which are sensitive to visible or ultra-violet light. Illustrative and suitable compounds include quinones, benzoquinones, anthraquinones and derivatives of these compounds, and anthraquinone disulfonic acids and their salts. Particularly suitable compounds are anthraquinone-2,6-(and 2,7)disulfonic acid disodium salts.

After exposure to the radiant energy source, the real image is treated with a fixing solution comprising a suitable solvent for the non-noble metal ions of the metal salt contained on the surface. The fixing solution comprises a conventional complexing or chelating agent for the non-noble metal ions. For copper ions, suitable complexing or chelating agents include ethylenediaminetetraacetic acid (EDTA), ethylenedinitrolotetra-2-propanol (EDTP), triethanolamine, malic acid, maleic acid, citric acid, tartaric acid, etc. Such complexing agents may readily be found by those skilled in the art by reference to standard works, such as, for example, Chaberek & Martell *Organic Sequestering Agents*, John Wiley & Sons, Inc., New York, 1958.

The fixing solution may optionally also comprise a reducing agent. A reducing agent is one which reduces a metal ion, e.g., $Cu^{+2}$, to its corresponding metal, e.g., $Cu°$, or to a lower oxidation state. Such reducing agents are well known in the art of electroless metal deposition. Where copper salts are used in the sensitizing solution of the subject invention, typical reducing agents include, under alkaline aqueous conditions ($pH>7$), formaldehyde and paraformaldehyde, and under acidic aqueous conditions ($pH<7$) ascorbic acid and hypophosphite species, e.g., sodium hypophosphite, potassium hypophosphite, etc. The reducing agent serves two purposes. As an antioxidant it prevents reoxidation of the metal nuclei comprising the real image. Autocatalytic ion reducing agents can also simultaneously reduce metal ions, e.g., $Cu^{+2}$, to its corresponding metal, e.g., $Cu°$, on the metal nuclei of the real image, thus reinforcing the real image.

The surface containing the real image is treated, e.g., by immersion, with the fixing solution for a period of time, e.g., typically 90 seconds and at a temperature, e.g., typically 20°. to 35° C., to fix the real image on adhesive coated epoxy glass laminates.

The fixing solution serves to wash out or remove the unexposed (as well as unfixed) portions of the sensitizing layer. The sensitizing layer comprises both the radiant energy sensitive compound and the reducible metal. When the radiant energy sensitive compound comprises an anthraquinone disulfonic acid it must be completely removed if the image is to be intensified in an electroless copper deposition solution. Anthraquinone disulfonic acids become chemical reducing agents at the high pH of electroless copper solutions and cause copper deposits outside of the image area. The fixed real image surface can be directly immersed or treated with an electroless metal deposition solution without additional rinsing steps. The fixed surface can however be water rinsed or rinsed with any other inert rinsing agent without fear of losing the real image. The fixed image containing surface (which may be water rinsed) is then immersed in a suitable electroless metal deposition solution to deposit an electroless metal deposit on the fixed image.

Suitable electroless metal deposition solutions are well known in the art and will not be elaborated herein. Reference in this regard is made to the patents incorporated hereinto by reference, which disclose some suitable electroless metal deposition solutions.

The electroless metal deposit may be built up to a desired thickness by prolonged exposure to the electroless metal deposition solution or, alternatively, may be further built up by being electroplated in a standard electroplating bath. Again, the various typical electroplating solutions, plating conditions and procedures are well known in the art and will not be elaborated herein. Again, reference in this regard is made to U.S. Pat. Nos. 3,772,056; 3,772,078; 3,907,621; 3,925,578; and 3,930,963, incorporated hereinto by reference.

Due to the lack of an analytical method to measure the on-going effectiveness of fixing solutions, as employed above, the prior practice was to replace the fixing solution whenever an undesirable color developed. The process improvement disclosed herein involves the use of a useful analytical technique to monitor the bath as well as a treatment which controls the concentration of the radiant energy absorbing compound at a selected level.

When the light radiation energy absorbing compounds, namely, anthraquinone, anthraquinone derivatives, anthraquinone disulfonic acids or salts thereof, are employed herein, the fixing solutions are maintained so that the concentration of the light sensitive reducing compound in the fixing solution does not exceed 0.4 m moles/liter. Such maintenance can be effected by carbon treatment of the fixing solution as the concentration rises and can be monitored with a double beam, U.V.-visible spectrophotometer and U.V. spectra recorded.

At 325 nm, a spectral peak is detected. The absorbance of this peak increases with increasing loading of circuit boards. By the term "loading" is meant the square decimeters of substrates per liter of the fixing solution.

In order to control the level of radiation energy absorbing compounds, e.g., anthraquinone derivatives, at a selected level, i.e. not exceeding 0.4 m moles/liter as monitored spectrophotometrically at about 320 nm, the fixing solution is treated with carbon. This treatment is preferentially effected by passing the fixing solution through a dense bed of activated granular carbon whereupon organic contaminants are absorbed and other particles are trapped. Contaminant-free clean and clear fixing solution is speedily recycled back to the fixer tank. With such carbon treatment, the fixing bath can be operated at very low contamination levels, monitored spectrophotometrically, and the bath remains water white.

The carbon, after used as described above, can be regenerated by treatment with sulfuric acid or with persulfate.

In the sulfuric acid method, 50% aqueous sulfuric acid is poured slowly into the carbon filler cartridge and allowed to sit for two hours. After rinsing with water, it is reactivated and can be reintroduced into processing.

In the persulfate method, the carbon container was treated for 1 hour with sodium persulfate solution (1 lb/gal., pH<3.5). After water rinsing, the carbon filler is reactivated.

EXAMPLE 1

An acidic fixer is made by dissolving 20 grams of maleic acid in one liter of water. The pH of the fixer solution is adjusted to 5.0 by sodium hydroxide. The fixer solution prepared shows no peak but strong absorption in UV range lower than 310 nm. This UV broad absorption is compensated by placing a fresh fixer solution instead of deionized water in the reference cell of the spectrophotometer. The addition of 0.084 g/l of 2,6-anthraquinone disulfonic acid disodium salt in the fixer solution with the compensation technique reveals a well-defined peak at 325 nm. The introduction of 0.168 g/l 2,6-anthraquinone doubles the absorption peak at 325 nm. A treatment of the anthraquinone containing fixer solution by 60 g/l granular activated carbon (12 by 40 US mesh) effectively removes the anthraquinone salt. A 2-hour carbon treatment almost removes about 50% of the anthraquinone salt as shown in the following table:

| Amount of 2,6-Anthraquinone Disulfonic Acid Disodium Salt | Carbon Treatment | Absorbance at $\lambda_{max}$ = 325 nm |
| --- | --- | --- |
| 0.00 m mol/l | None | 0.01 |
| 0.2 m mol/l | None | 1.06 |
| 0.4 m mol/l | None | 2.08 |
| 0.4 m mol/l | 2 hour | 1.06 |
| 0.4 m mol/l | 4 hour | 0.65 |
| 0.4 m mol/l | 24 hour | 0.29 |

Glass cloth reinforced epoxy resin-laminate sheets, NEMA Grade FR-4, were supplied with an oxidizable phenolic resin-nitrile rubber coating by the procedure of Polichette, U.S. Pat. No. 3,956,041. The sheets were cut into smaller panels for the manufacture of printed circuits. The Panels were adhesion promoted by a ten minute immersion in the following solution at 40° C.:
Chromium trioxide: 100 g/l
Sulfuric acid: 550 g/l
Sodium fluoride: 10 g/l This was followed by a rinse, immersion in a reducing solution to reduce residual hexavalent chromium, and another rinse.

After adhesion promotion the panels were immersed for ten minutes in the sensitizer solution of example 31 of Polichette et al, U.S. Pat. No. 3,994,727. The panels were removed from the sensitizer solution; excess sensitizer was wiped from the surface with a synthetic elastomer sponge; and the sensitizer coating on the panels were dried for three minutes at 50° C. The sensitizer coatings on the panels were exposed to ultraviolet light through a negative mask to form printed circuit images. The exposures were one minute to a two kilowatt mercury vapor lamp. After exposure, the images were fixed by immersion in the maleic acid fixer described above. The immersions in the fixer were varied between two minutes and ten minutes. The panels were then rinsed for three minutes in running water and inspected. No weakening of the image or wash off of portions of the image had occurred.

The panels were placed in an electroless copper strike bath long enough to form a stabilized conductive copper pattern approximately 2 micrometers thick. The electroless copper strike bath was:
Copper (II) salt: 0.05 mole/l
Ethylenediaminetetra-2-propanol: 0.08 mole/l
Formaldehyde: 0.05 mole/l
Alkylphenoxyglycidolphosphate ester: 0.0009 mole/l
Sodium cyanide: 0.0002 mole/l
2-mercaptobenzothiazole: 0.0000003 mole/l
Sulfide ion: 0.000005 mole/l
Alkali metal hydroxide: to pH 12.8
Temperature: 52° C.

These stabilized images were inspected and found substantially free of extraneous copper deposits, i.e. copper nodules deposited outside of the conductor image.

The panels were placed in a second electroless copper plating solution to deposit 35 micrometers of copper on the stabilized conductor image, thus completing the printed circuit plating. This second electroless copper solution was:
Copper (II) salt: 0.04 mole/l
Ethylenedinitrilotetra-2-propanol: 0.12 mole/l
Formaldehyde: 0.05 mole/l
Alkylphenoxyglycidolphosphate ester: 0.0002 mole/l
Sodium cyanide: 0.0005 mole/l
2 mercaptobenzothiazole: 0.0000003 mole/l Sulfide: 0.000005 mole/l
Alkali metal hydroxide: to pH 12.8
temperature: 52° C.

After 0.03 square meters of panel surface per liter were processed through the fixer solution, the panels showed some extraneous copper particles. The fixer solution was analyzed by ultraviolet spectroscopy and found to contain 0.12 m mol/l of anthraquinone disulfonic acid. The fixer solution was circulated through a carbon packed filter until the anthraquinone disulfonic acid concentration was reduced to essentially zero. The fixer was then used to process additional panels.

EXAMPLE 2

The addition of 2,7-anthraquinone disulfonic acid disodium salt to the maleic acid fixer solution following the same procedures as described in Example 1 also shows a well-defined absorption peak at 325 nm. The direct proportionality of the absorbance vs. concentration is also demonstrated in the following table. The anthraquinone salt is sufficiently removed by carbon treatment:

| Amount of 2,7-Anthraquinone Disulfonic Acid Disodium Salt Added | Carbon Treatment | Absorbance at $\lambda_{max}$ = 325 nm |
| --- | --- | --- |
| 0.2 m mol/l | None | 0.89 |
| 0.4 m mol/l | None | 1.90 |
| 0.4 m mol/l | 2 hour | 0.84 |
| 0.4 m mol/l | 4 hour | 0.43 |
| 0.4 m mol/l | 24 hour | 0.16 |

EXAMPLE 3

An acid fixer or stripping solution, comprising 1% citric acid was prepared according to the procedures of Beckenbaugh et. al. (U.S. Pat. No. 4,181,750).

The acid fixer prepared shows a broad band ranging from 380 nm to 200 nm. The addition of 2,6-anthraquinone salt in the fixer shifts the band ranging from 340 nm to 200 nm. Application of the compensation of the UV band with fresh fixer solution reveals the peak at 343 nm. This peak shows direct proportionality as shown in the following table:

| Amount of 2,6-Anthraquinone Disulfonic Acid Disodium Salt Added | Carbon Treatment | Absorbance at $\lambda_{max}$ = 343 nm |
| --- | --- | --- |
| 0.00 m mol/l | None | 0.00 |
| 0.2 m mol/l | None | 0.39 |
| 0.4 m mol/l | None | 0.75 |
| 0.4 m mol/l | 4 hour | 0.00 |

The carbon treatment of 4 hours completely removes anthraquinone salt.

EXAMPLE 4

2,7-Anthraquinone disulfonic acid disodium salt in acid fixer prepared as Example 3 shows the same peak at 343 nm. The direct proportionality can be seen in the following table:

| Amount of 2,7-Anthraquinone Disulfonic Acid Disodium Salt Added | Carbon Treatment | Absorbance at $\lambda_{max}$ = 343 nm |
| --- | --- | --- |
| 0.00 m mol/l | None | 0.00 |
| 0.2 m mol/l | None | 0.33 |
| 0.4 m mol/l | None | 0.66 |
| 0.4 m mol/l | 4 hour | 0.00 |

EXAMPLE 5

The procedure of example 1 is repeated except that the maleic acid fixer is replaced by a citric acid fixer of the following formulation:
Citric acid: 10 g/l
Ethylenedinitrilotetra-2-propanol: 5 g/l
Cupric acetate: 2 g/l
Sodium hydroxide: to pH 6
Ascorbic acid: 5 g/l This fixer darkens that image indicating the fixer containing copper ions and an ascorbic acid reducing agent not only prevents formation of extraneous copper sites but reinforces the image, preventing image wash off.

When 0.06 square meters of surface is passed through the fixer, extraneous copper sites are found after electroless copper plating. The fixer solution is analyzed spectrophotometrically and found to contain 0.12 m mol/l anthraquinone disulfonic acid. It is circulated through an activated carbon bed. When the spectrophotometric analysis shows fixer is 0.05 m mol/l anthraquinone disulfonic acid, the pH is readjusted to 6 and one additional 0.06 square meters of surface are processed through the fixer.

EXAMPLE 6

The addition of 2,6-anthraquinone salt to the 10% (by volume) acetic acid fixer solution shows a peak at 325 nm. The absorbance at 325 nm is directly proportional to the concentration of the anthraquinone salt as shown in the following table. The efficiency of the removal of the salt by carbon treatment is also shown in the table:

| Amount of 2,6-Anthraquinone Disulfonic Acid Disodium Salt Added | Carbon Treatment | Absorbance at $\lambda_{max}$ = 325 nm |
| --- | --- | --- |
| 0.2 m mol/l | None | 1.06 |
| 0.4 m mol/l | None | 2.11 |
| 0.4 m mol/l | 2 hour | 1.20 |
| 0.4 m mol/l | 4 hour | 0.78 |
| 0.4 m mol/l | 24 hour | 0.45 |

EXAMPLE 7

The absorbance of 2,7-anthraquinone salt at 325 nm in the 10% (by volume) acetic acid also shows direct proportionality to the 2,7-salt concentration as shown in the following table:

| Amount of 2,7-Anthraquinone Disulfonic Acid Disodium Salt Added | Carbon Treatment | Absorbance at $\lambda_{max}$ = 325 nm |
| --- | --- | --- |
| 0.2 m mol/l | None | 0.89 |
| 0.4 m mol/l | None | 1.79 |
| 0.4 m mol/l | 2 hour | 0.95 |
| 0.4 m mol/l | 4 hour | 0.58 |
| 0.4 m mol/l | 24 hour | 0.34 |

EXAMPLE 8

An alkaline EDTA formaldehyde fixer is formed by mixing 100 ml of 37% formaldehyde, 40 grams of tetrasodium EDTA in enough water to make a liter with a pH adjusted to 12.5. The fixer solution prepared shows no peak at 325 nm and its absorbance at 325 nm reads 0.01. An addition of 0.084 g/l of 2,6-anthraquinone disulfonic acid disodium salt in the fixer solution introduces a peak at 325 nm with an absorbance reading of 1.08. Double the concentration of 2,6-anthraquinone in the fixer solution doubles the absorbance at the wave length of 325 nm as indicated in Table below. A treatment of the anthraquinone containing fixer solution by 60 g/l granular activated carbon (12 by 40 US mesh) removes the anthraquinone salt as indicated by the absorption measurement at 325 nm in the following table.

| Amount of 2,6-Anthraquinone Disulfonic Acid Disodium Salt Added | Carbon Treatment | Absorbance at $\lambda_{max}$ = 325 nm |
| --- | --- | --- |
| 0.0 m mol/l | None | 0.01 |
| 0.2 m mol/l | None | 1.08 |
| 0.4 m mol/l | None | 2.15 |
| 0.4 m mol/l | 2 hours | 0.73 |
| 0.4 m mol/l | 4 hours | 0.50 |

A 2 liter solution of alkaline-EDTA-formaldehyde fixer solution was made.

It is processed with printed circuit boards according to the invention. The sensitizer solution of example 1 was used except that it was diluted with 30% ethanol. The fixer solution shows increasing absorbance at 325 nm as the loading increases.

A Sethco carbon filter cartridge was applied when 0.01 to 0.02 square meters per liter boards were processed or when the rusty-red color appeared. Organic impurities were absorbed by the dense bed of activated, granular carbon and finally stray particles down to ten microns were trapped in the double-layered polypropylene inner sleeve filter wrapped over an inert polypropylene mesh core. Contaminant-free clean and clear solution was speedily recycled back into the fixer solution.

The electroless copper bath used and the second electroless copper plating bath used had the same formulation as the second electroless copper plating bath of Example 1 except that the stabilizers, mercapto benzothiazole and sulfide, were replaced by the stabilizers of Ehrich et al U.S. Pat. No. 4,262,085. Printed circuit boards thus processed consistently show extraneous free quality.

EXAMPLE 9

The addition of 2,7-anthraquinone to the alkaline EDTA formaldehyde fixer solution followed the same procedures as Example 7 also shows a well-defined wave at 325 nm. The direct proportionality of the absorbance vs. concentration is also demonstrated in the following table. Sufficient removal of the anthraquinone salt by the carbon treatment is also indicated in the table.

| Amount of 2,7-Anthraquinone Disulfonic Acid Disodium Salt Added | Carbon Treatment | Absorbance at $\lambda_{max}$ = 325 nm |
| --- | --- | --- |
| 0.00 m mol/l | None | 0.01 |
| 0.2 m mol/l | None | 0.96 |
| 0.4 m mol/l | None | 1.86 |
| 0.4 m mol/l | 2 hours | 0.81 |
| 0.4 m mol/l | 4 hours | 0.53 |

It should be understood by those skilled in the art that various modifications may be made in the present invention without departing from the spirit and scope thereof as described in the specification and defined in the appended claims.

What is claimed is:

1. In a method for making conductive metal patterns by treating a substrate with a solution comprising a reducible salt of a non-noble metal and a light radiation sensitive reducing compound selected from quinones, benzoquinones, anthraquinones and derivatives thereof, and anthraquinone disulfonic acids and salts thereof;

exposing the treated substrate to light radiant energy to reduce the metal salt to form a real image; and immersing the substrate in an electroless metal deposition bath to deposit a conductive metal pattern on the real image;

the improvement comprising treating the exposed substrate, prior to electrolessly depositing metal in a fixed bath with a fixing solution comprising a complexing agent for the non-noble metal wherein as a result of said treatment, light sensitive reducing compound builds up in the bath;

said fixing solution being maintained so that the concentration of the light sensitive reducing compound in the fixing solution does not exceed 0.4 m moles/liter.

2. The method of claim 1 wherein the concentration of light sensitive reducing compound is maintained by carbon treatment of the fixing solution when the concentration approaches 0.4 m moles/liter.

3. The method of claim 2 wherein the concentration of light sensitive reducing compound is maintained by carbon treatment of the fixing solution when the concentration approaches 0.15 m moles/liter.

4. The method of claim 1 wherein the concentration of light sensitive reducing compound is maintained by carbon treatment of the fixing solution when the concentration approaches 0.4 m moles/liter as determined by spectrographic analysis.

5. The method of claim 4 wherein the concentration of light sensitive reducing compound is maintained by carbon treatment of the fixing solution when the concentration approaches 0.15 m moles/liter.

6. The method of claim 1 wherein the concentration of light sensitive reducing agent is maintained by continuously carbon treating the fixing solution.

7. The method of claim 6 wherein the concentration of the light sensitive reducing agent in the fixing solution is maintained at 0.05 m moles/liter or less.

8. The method of claim 1 wherein the reducible salt of a non-noble metal is selected from the group consisting of reducible salts of copper, iron, nickel and cobalt.

9. The method of claim 1 wherein the light radiation sensitive reducing compound is an anthraquinone disulfonic acid salt selected from anthraquinone-2,6-disulfonic acid disodium salt and anthraquinone-2,7-disulfonic acid disodium salt.

10. The method of claim 1 wherein the complexing agent is selected from ethylenediaminetetraacetic acid (EDTA), ethylenedinitrilotetra-2-propanol (EDTP), malic acid, maleic acid, citric acid, tartaric acid and triethanolamine.

11. The method of claim 4 wherein said treatment with carbon is effected in a continuous manner wherein the treated fixing solution is recycled during processing.

12. The method of claim 4 wherein said carbon is regenerated by treatment with sulfuric acid.

13. The method of claim 4 wherein said carbon is regenerated by treatment with sodium persulfate.

14. In a method for making conductive metal patterns by treating a substrate with a solution comprising a reducible salt of a non-noble metal and a light radiation sensitive reducing agent selected from quinones, benzoquinones, anthraquinones and derivatives thereof, and anthraquinone disulfonic acids and salts thereof;

exposing the treated substrate to light radiant energy to reduce the metal salt to form a real image; and immersing the substrate in an electroless metal deposition bath to deposit a conductive metal pattern on the real image;

the improvement comprising treating the exposed substrate, prior to electrolessly depositing metal in a fixed bath with a fixing solution comprising a complexing agent for the non-noble metal and a reducing agent, wherein as a result of said treatment, light sensitive reducing compound builds up in the bath;

said fixing solution being maintained so that the concentration of the light sensitive reducing compound in the fixing solution does not exceed 0.4 m moles/liter.

15. The method of claim 14 in which the concentration of the light sensitive reducing compound in the fixing solution does not exceed 0.15 m moles/liter.

16. The method of claim 15 in which the concentration of the light sensitive reducing compound in the fixing solution does not exceed 0.05 m moles/liter.

17. The method of claim 14 wherein the reducing agent is selected from formaldehyde and ascorbic acid.

18. The method of claim 17 wherein the reducing agent comprises formaldehyde.

19. The method of claim 17 wherein the reducing agent comprises ascorbic acid.

* * * * *